(12) United States Patent
Torigoe et al.

(10) Patent No.: US 6,927,655 B2
(45) Date of Patent: Aug. 9, 2005

(54) OPTICAL TRANSMISSION MODULE

(75) Inventors: Makoto Torigoe, Tokyo (JP); Takashi Suga, Tokyo (JP)

(73) Assignee: OpNext Japan, Inc., Yokohama (JP)

( * ) Notice: Subject to any disclaimer, the term of this patent is extended or adjusted under 35 U.S.C. 154(b) by 157 days.

(21) Appl. No.: 10/226,575

(22) Filed: Aug. 23, 2002

(65) Prior Publication Data

US 2004/0037516 A1 Feb. 26, 2004

(51) Int. Cl.$^7$ .............................................. H01P 5/08
(52) U.S. Cl. ...................................... 333/260; 333/33
(58) Field of Search ............................ 333/260, 33, 245, 333/246

(56) References Cited

U.S. PATENT DOCUMENTS

| | | | | |
|---|---|---|---|---|
| 5,404,117 A | * | 4/1995 | Walz | ............................ 333/34 |
| 6,100,774 A | * | 8/2000 | Cox et al. | ..................... 333/33 |
| 6,661,318 B2 | * | 12/2003 | Tamaki et al. | .............. 333/260 |
| 6,774,742 B1 | * | 8/2004 | Fleury et al. | .................. 333/33 |

* cited by examiner

Primary Examiner—Stephen E. Jones
(74) Attorney, Agent, or Firm—Townsend and Townsend and Crew LLP

(57) ABSTRACT

There is provided a thin and small size connector-less optical transmission module M which assures excellent high frequency characteristic. This optical transmission module comprises transmission line substrates and a coaxial cable for connecting these transmission line substrates and is connected to the transmission line substrate via a contact sleeve which is provided with projections fixed to the external conductor of the coaxial cable and projected in the extending direction of the coaxial cable. Since an electromagnetic field mode alleviating portion formed of a dielectric material is provided to the core wire of the coaxial cable, the thin and small size optical transmission module M can assure less amount of radiation of an interference electromagnetic wave, high frequency characteristic through connection with the coaxial cable.

4 Claims, 11 Drawing Sheets

OPTICAL TRANSMISSION MODULE

BACKGROUND OF THE INVENTION

1. Field of the Invention

The present invention relates to an optical transmission module and particularly to an optical transmission module in which a connection method of a high frequency transmission cable is utilized.

2. Related Background Art

An optical transmission module includes components mounted on different circuit boards. These components are connected with a bonding wire or a coaxial cable.

When these components are connected with a bonding wire, an inductance increases according to the length of the bonding wire (connection distance). Therefore, this bonding wire is not suitable for transmission of a high frequency signal.

Meanwhile, since a coaxial cable is covered with an external conductor, when the connection distance becomes longer, an inductance does not become larger than that of a bonding wire. Therefore, connection by a coaxial cable is suitable for transmission of a high frequency signal.

In the case where a coaxial cable is connected to a coplanar transmission line, a core wire which appears when the external conductor of a coaxial cable is peeled is connected to a signal line of the coplanar transmission line. Therefore, the external conductor does not exist in a certain area of the circumference of the core wire of a coaxial cable. In the circumferential area covered with the external conductor, a uniform electromagnetic field is generated in the direction of normal line from the signal wire. However, in the boundary to the area where the external conductor does not exist in the circumferential area of the core wire of a coaxial cable, direction of the electromagnetic field changes extremely. Extreme change of the direction of electromagnetic field causes degradation of transmission efficiency of an high frequency signal. Moreover, since the thin external conductor of a coaxial cable is spreading in the circumferential area of the signal wire, it has been difficult to realize the connection of such external conductor with a ground electrode of the coplanar transmission line substrate.

As a method of improving the transmission efficiency of a high frequency signal and also improving the connection property, there is proposed a method of using a connector.

Referring to FIGS. 10A and 10B, a connection structure between a coaxial cable and a coplanar transmission line using a connector will be explained.

As illustrated in FIG. 10A, a male connector S1 connected to an external conductor of coaxial cable is mounted at one end of the coaxial cable and a female connector S2 is formed at a part of the side wall of a housing to which a coplanar transmission line is mounted. The male connector S1 has the diameter of about 3.8 mm (FIG. 10B) to 9 mm (FIG. 10A) and is soldered with the external conductor of the coaxial cable. A core wire of the coaxial cable is led out from one end thereof. Since the female connector S2 is required to have a constant thickness in order to fix the male connector S1, this connector S2 is formed thicker than the male connector S1. Therefore, this female connector S2 is fixed by soldering process to a ground electrode of a coplanar transmission line by utilizing such thickness.

An optical transmission module in future tends to have a thin structure but thickness of connector has been considered as a cause which disables realization of thin structure of an optical transmission module as a whole. Therefore, the inventors of the present invention have discussed a small thickness structure of a connector.

The inventors of the present invention has proposed a structure of a connector in which a connector is formed of one member in place of forming a structure composed of a male connector and a female connector. Namely, a connector (contact sleeve) is formed of an individual thin cylindrical member which is not a part of a housing.

As a result of actual connection using such contact sleeve, it has been proved that when the contact sleeve is formed thinner, poor connection is easily generated in the solder connection to the ground electrode of a coplanar transmission line. It has also become obvious that if such poor connection is generated, a signal wire as the core wire of a coaxial cable is no longer covered with an external conductor at a certain area and a fine potential difference is generated in the ground potential of a ground wire between the contact sleeve and the coplanar transmission line. Thereby, an electric field centralized toward the respective ground electrodes of the contact sleeve and coplanar transmission line in such area of the coaxial cable not covered with the external conductor and the electromagnetic field is deflected due to such potential difference. Accordingly, the transmission efficiency of a high frequency signal has been lowered.

SUMMARY OF THE INVENTION

It is therefore an object of the present invention to provide a connector which can improve transmission efficiency of a high frequency signal while realizing a thin structure.

In order to achieve the object explained above, an optical transmission module of the present invention has a structure which comprises transmission line substrates and a coaxial cable for connecting these transmission line substrates. An external conductor is connected to the transmission line substrates via a contact sleeve which is provided with a projection which is fixed to the external conductor of the coaxial cable, and is projected in the extending direction of the coaxial cable.

The optical transmission module of the present invention also has another structure which comprises a second layer which is formed of a metal member or a ground substrate, a first layer including a grounded coplanar line formed on the second layer and a coaxial cable, in which a core wire is connected to a signal electrode of the first layer. The metal member or ground substrate is exposed by a groove disposed to the first layer, and the exposed areas are connected with a contact sleeve connected to the external conductor of the coaxial cable.

The optical transmission module of the present invention also has the other structure which comprises a second layer which is formed of a metal member or a ground substrate, a first layer including a grounded coplanar line formed on the second layer and a coaxial cable of which core wire is connected to the signal electrode of the first layer and is characterized in that the second layer includes a projection which is projected in the extending direction of the coaxial cable more than the first layer and the contact sleeve connected to the external conductor of the coaxial cable is connected to the projection of the second layer.

According to the present invention, a thin and small size optical transmission module connected to a coaxial cable which assures less radiation of interfering electromagnetic wave, excellent high frequency characteristic and no-generation of mechanical damage can be attained by providing an electromagnetic field mode alleviating portion of a dielectric material to the core wire part of the coaxial cable without use of a connector for connection.

DETAILED DESCRIPTION OF THE PREFERRED EMBODIMENTS

Each embodiment of an optical transmission module of the present invention will be explained with reference to FIGS. 1A and 1B to FIGS. 9A, 9B, 9C and 9D. An optical transmission module is classified into one optical transmission module which emits an optical signal when an electrical signal is inputted and the other optical transmission module which generates an electrical signal when an optical signal is inputted. The former optical transmission module will be explained as an example of the preferred embodiment.

Figure 1A:
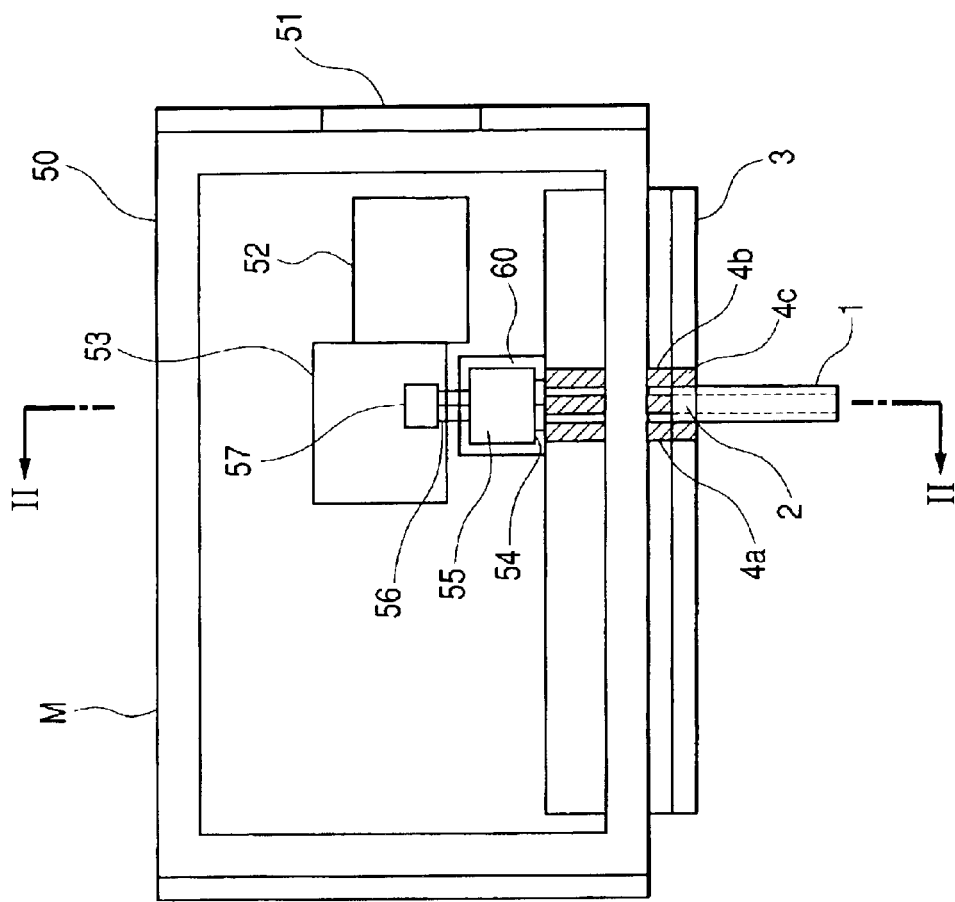
FIGS. 1A and 1B are diagrams illustrating an optical transmission module as an embodiment of the present invention.
Figure 1B:
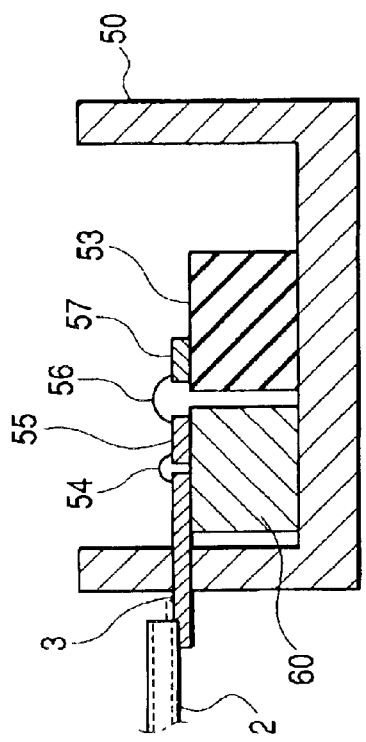
Figure 3:
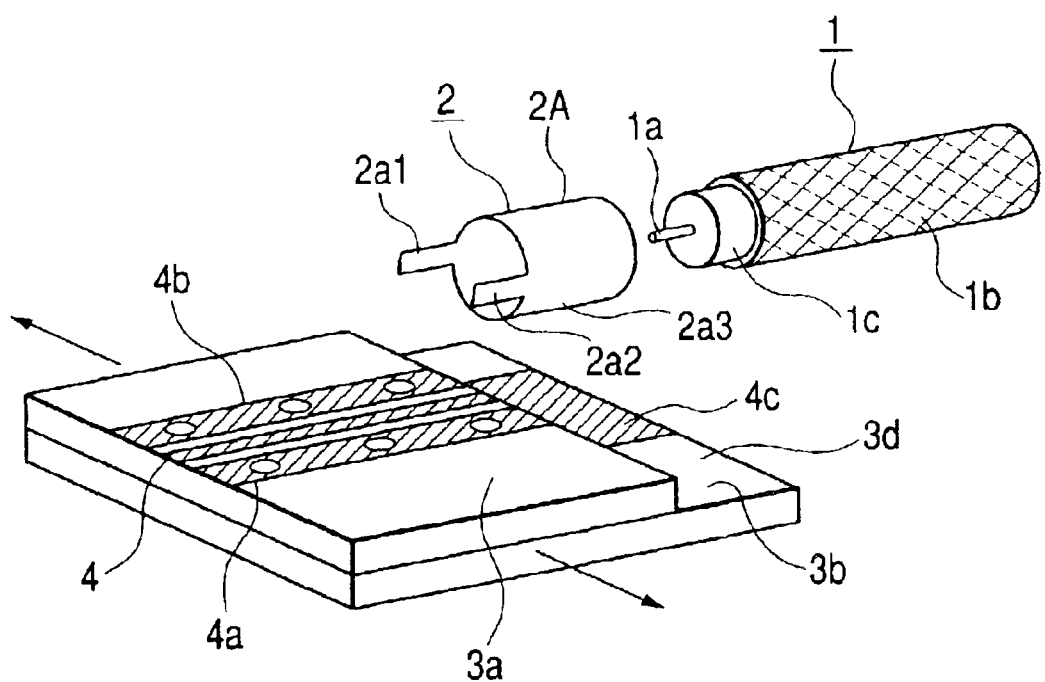
FIG. 3 is a diagram illustrating connection between the grounded coplanar line substrate and a coaxial cable using a contact sleeve in the optical transmission module of FIGS. 1A and 1B.
Figure 4A:
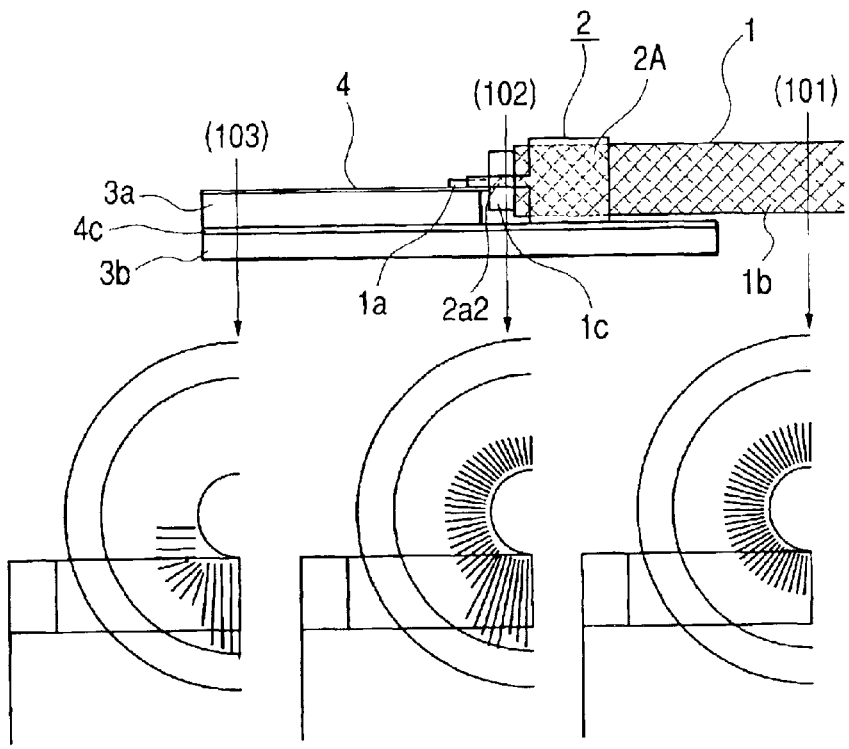
FIGS. 4A and 4B are diagrams illustrating transition of the lines of electric force in the contact sleeve of the optical transmission module of FIG. 3.
Figure 4B:
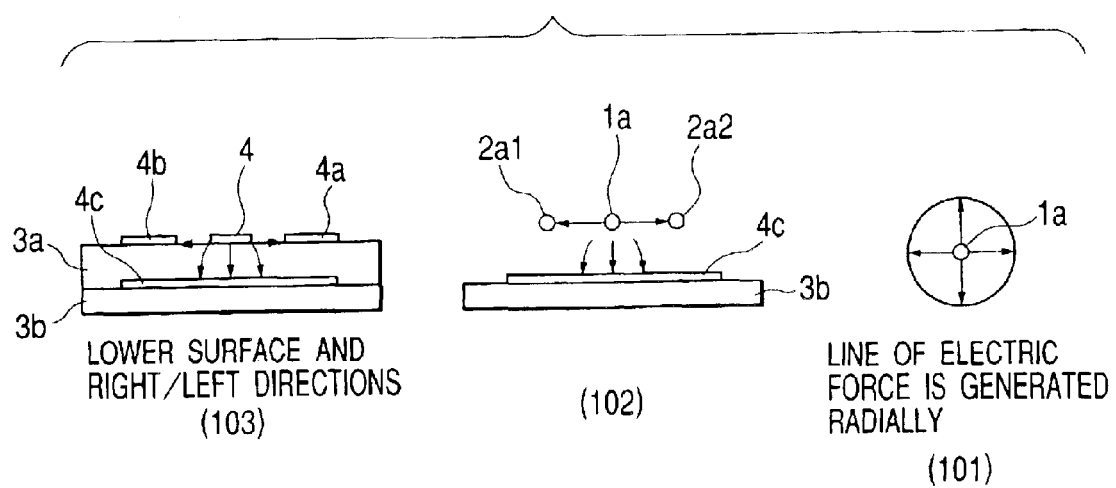
Figure 5A:
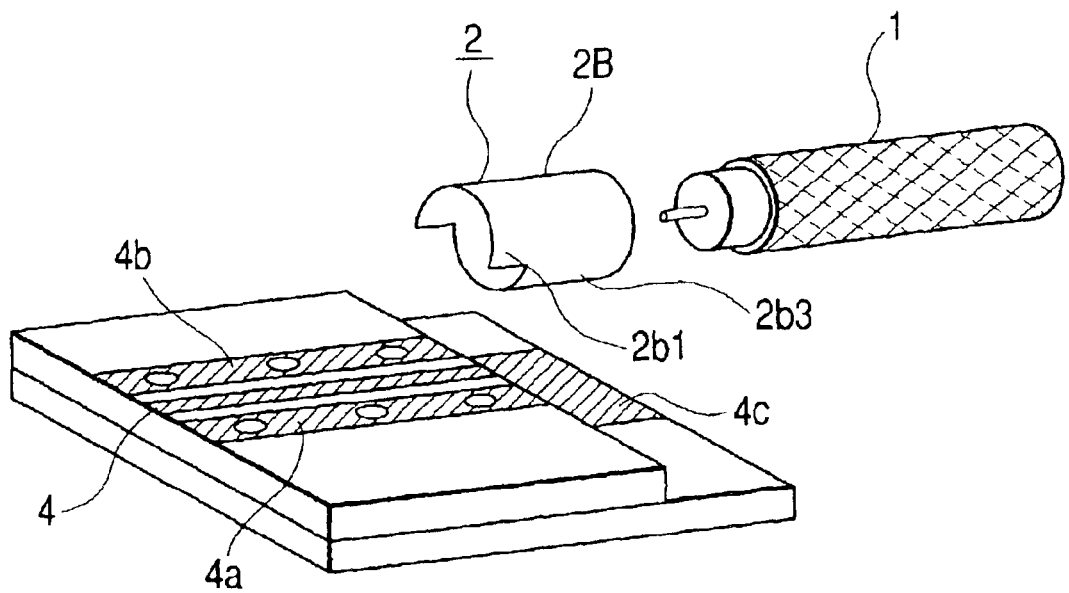
FIGS. 5A and 5B are diagrams illustrating connection between the grounded coplanar line substrate and coaxial cable using the other contact sleeve in the optical transmission module of FIGS. 1A and 1B.
Figure 5B:
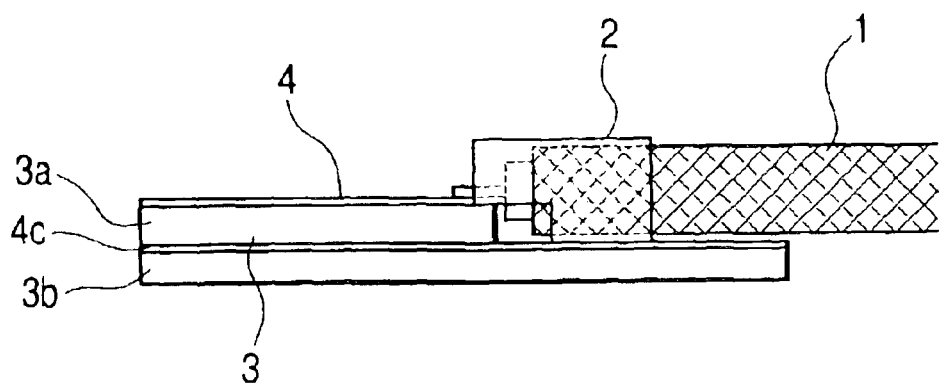
Figure 6A:
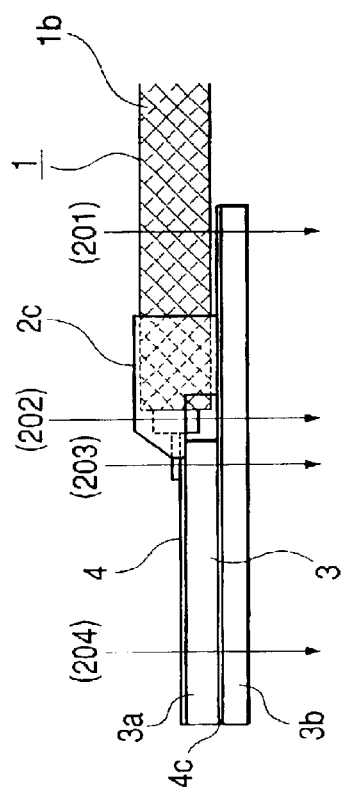
FIGS. 6A, 6B and 6C are diagrams illustrating connection between the grounded coplanar line substrate and coaxial cable using the other contact sleeve in the optical transmission module of FIGS. 1A and 1B.
Figure 6B:
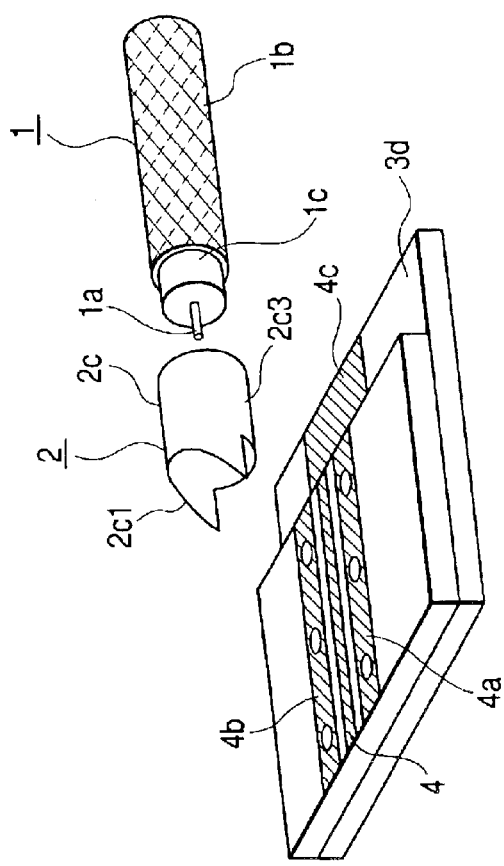
Figure 6C:
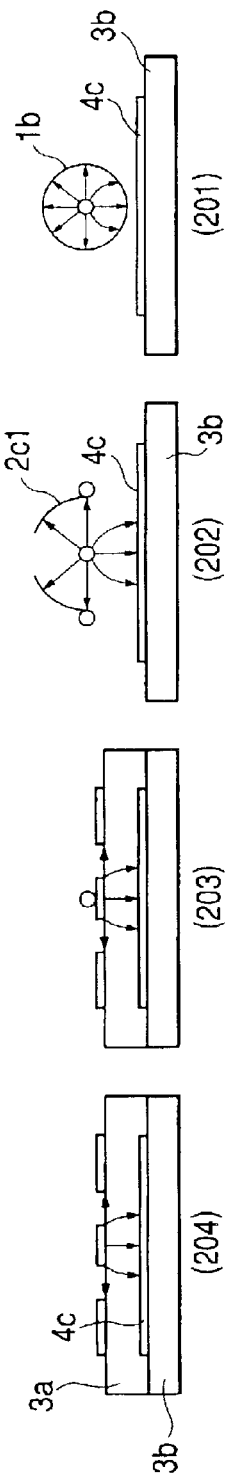
Figure 7A:
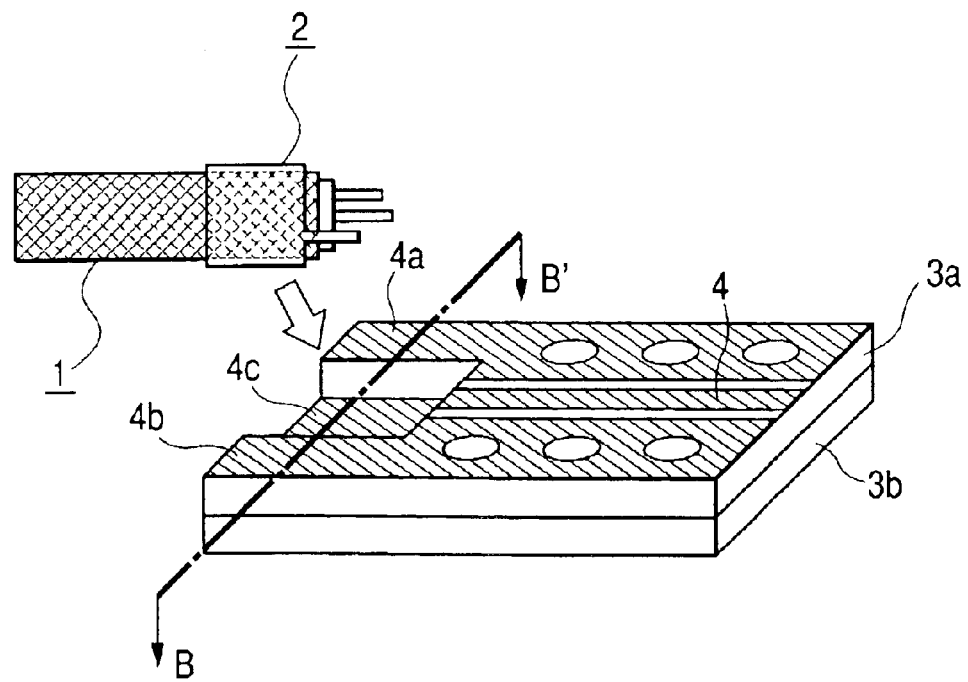
FIGS. 7A and 7B are diagrams illustrating the other connection between the grounded coplanar line substrate and coaxial cable in the optical transmission module of FIGS. 1A and 1B.
Figure 7B:
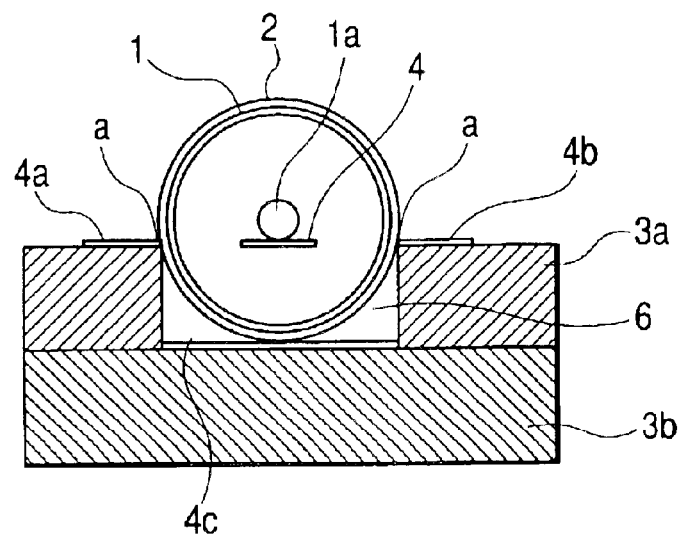
Figure 8A:
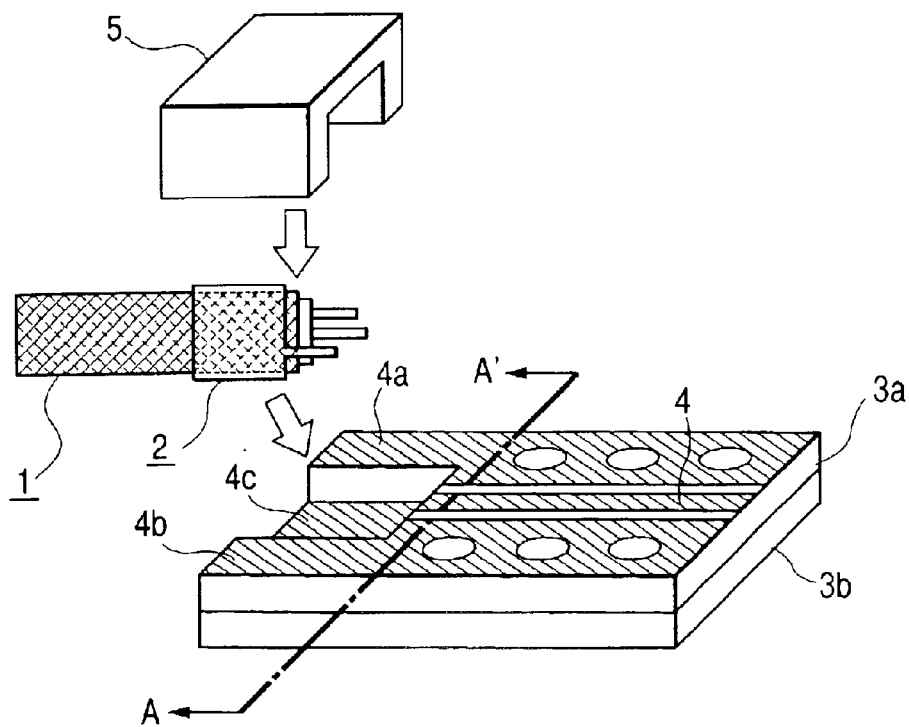
FIGS. 8A and 8B are diagrams illustrating the other connection between the grounded coplanar line substrate and coaxial cable in the optical transmission module of FIGS. 1A and 1B.
Figure 8B:
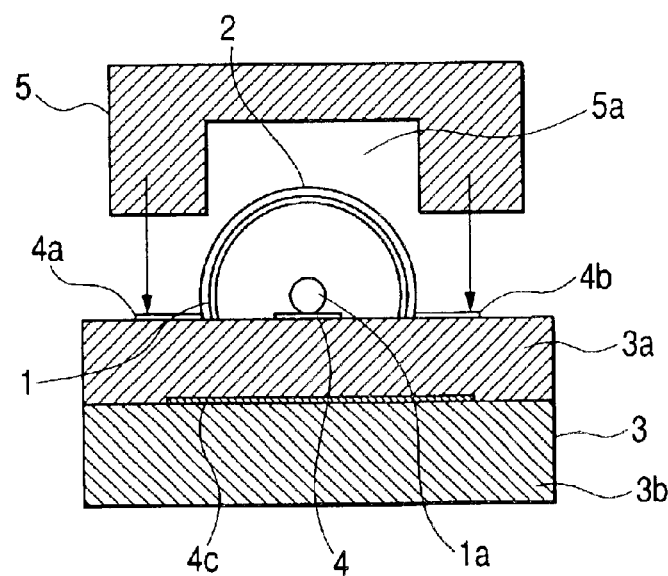

FIGS. 1A and 1B are diagrams illustrating an optical transmission module as an embodiment of the present invention. FIGS. 2A, 2B, 2C, 2D, 2E are diagrams illustrating a grounded coplanar line substrate in the optical transmission module of FIGS. 1A and 1B. FIG. 3 is a diagram illustrating connection between the grounded coplanar line substrate and a coaxial cable using a contact sleeve in the optical transmission module of FIGS. 1A and 1B. FIGS. 4A and 4B are diagrams illustrating transition of the lines of electric force in the contact sleeve of the optical transmission module of FIG. 3. FIGS. 5A and 5B are diagrams illustrating connection between the grounded coplanar line substrate and coaxial cable using the other contact sleeve in the optical transmission module of FIGS. 1A and 1B. FIGS. 6A, 6B and 6C are diagrams illustrating connection between the grounded coplanar line substrate and coaxial cable using the other contact sleeve in the optical transmission module of FIGS. 1A and 1B. FIGS. 7A and 7B are diagrams illustrating the other connection between the grounded coplanar line substrate and coaxial cable in the optical transmission module of FIGS. 1A and 1B. FIGS. 8A and 8B are diagrams illustrating the other connection between the grounded coplanar line substrate and coaxial cable in the optical transmission module of FIGS. 1A and 1B. FIGS. 9A, 9B, 9C and 9D are diagrams illustrating a high frequency characteristic in each embodiment of the optical transmission module of the present invention.

[Embodiment 1]

The embodiment 1 and its modification example of an optical transmission module to achieve the first object will be explained with reference to the drawings of FIG. 1 to FIG. 6. In FIGS. 1A and 1B, a housing 50 of the optical transmission module M is provided at its interior with a metal block 53 placing a lens 52 coupled with an optical output 51 provided to one of the short-end portions. An optical element 57 is placed on the metal block 53. Meanwhile, a ceramic grounded coplanar line substrate 3 is loaded to one of the long-end portions at the housing 50 of the optical transmission module M.

The ceramic grounded coplanar line substrate 3 has a grounded coplanar structure. This grounded coplanar line structure will be explained later with reference to FIG. 2. The grounded coplanar line substrate 3 of ceramic is provided with a signal electrode 4 and ground electrodes 4a, 4b, 4c which are connected with a coaxial cable 1 for transmitting a high frequency signal via a contact sleeve 2.

The grounded coplanar line substrate 3 is mounted to the housing 50 and is also placed on a metal base 60. Moreover, in addition to the signal electrode 4 and ground electrodes 4a, 4b, 4c, a power supply line conductor and a control line conductor or the like are also provided actually but these are omitted to simplify the figure.

These signal electrode 4 and ground electrodes 4a, 4b are connected to the optical element 57 from the direction orthogonal to an output direction of the optical element 57. Moreover, in this connection route, a driving and amplifying element 55 is disposed to amplify an electrical signal sent from the coaxial cable 1 and supply a drive signal to the optical element 57.

The driving and amplifying element 55 is located on the base 60 on which the grounded coplanar line substrate 3 is also provided. The base 60 is used in common for the driving and amplifying element 55 and grounded coplanar line substrate 3.

The conductor wires 56, 54 are used for connection between the driving and amplifying element 55 and optical element 57 and between the ground electrodes 4a, 4b and the driving and amplifying element 55. Detail illustration and explanation are omitted here but a Peltier cooler for cooling and a thermistor for detecting temperature or the like are usually provided at the inside of the housing 50 of the optical transmission module M.

Next, connection of the coaxial cable 1 and the grounded coplanar line substrate 3 and connection of the coaxial cable 1 and the grounded coplanar line substrate 3 will be explained with reference to FIGS. 2A, 2B, 2C, 2D, 2E and FIG. 3. In order to simplify the explanation, the grounded coplanar line substrate 3 is removed from the housing 50.

As illustrated in FIG. 3, the coaxial cable 1 comprising a cylindrical external conductor 1b, a core line 1a provided at the center of external conductor and an insulator 1c filling the area between these core line 1a and conductor 1b. These elements are bundled concentrically. From the point of view of the structure, transmission loss in the high frequency band is considerably small and crosstalk characteristic can be improved.

As illustrated in FIGS. 2A to 2E, the grounded coplanar line substrate 3 is a part of the substrate extended in the direction of arrow mark as illustrated in FIGS. 1A and 1B and comprising an upper substrate 3a of a first layer of the grounded coplanar line structure, the ground electrodes 4a, 4b of the grounded coplanar structure of the first layer and a lower substrate 3b of a second layer provided with the ground electrode 4c connected by the soldering process.

Figure 2A:
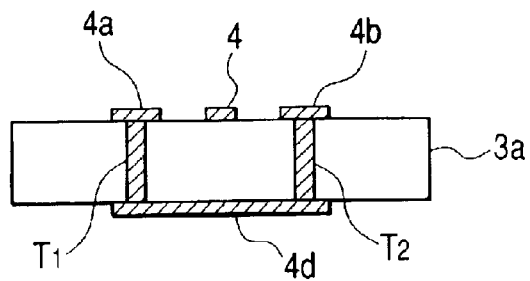
FIGS. 2A, 2B, 2C, 2D, 2E are diagrams illustrating a grounded coplanar line substrate in the optical transmission module of FIGS. 1A and 1B.

As illustrated in FIG. 2A, the upper substrate 3a of the first layer is formed of a rectangular ceramic material with a line of signal electrode 4 and two lines of ground electrodes 4a, 4b in parallel to the longitudinal direction of the rectangular ceramic material through the burning of the conductive paste, plating or photoresist. On the rear surface of the upper substrate 3a, the ground electrode 4d is formed with burning of conductive paste, plating or photoresist. A bore is formed with a drill or laser to the ground electrode 4d at the rear surface from the ground electrodes 4a, 4b to form through-holes T1, T2 (three holes in each conductors). These through-holes are filled with the through-hole plating or conductive paste and these are burned. Thereby, the ground electrodes 4a, 4b and the ground electrode 4d are connected through the through-holes.

With formation of such signal electrode and ground electrodes, unbalance of induced voltage generated in the direction orthogonal to the ground electrodes 4a, 4b of the upper substrate 3a of the first layer can be eliminated.

Figure 2B:
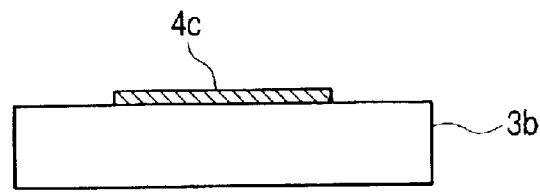

As illustrated in FIG. 2B, the second layer (the lower substrate) 3b is formed, like the first layer, of a rectangular ceramic material with a line of wide ground electrode 4c parallel to the longitudinal direction of such rectangular ceramic material through the burning of the conductive paste. The transmission line substrate having formed the ground electrode is called the "ground substrate". The transmission line substrate 3b of the second layer is formed at little longer than the first layer as required in the longitudinal direction of the rectangular ceramic material.

Figure 2C:
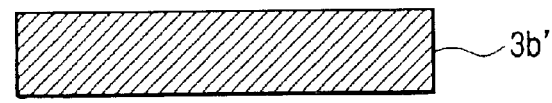
Figure 2D:
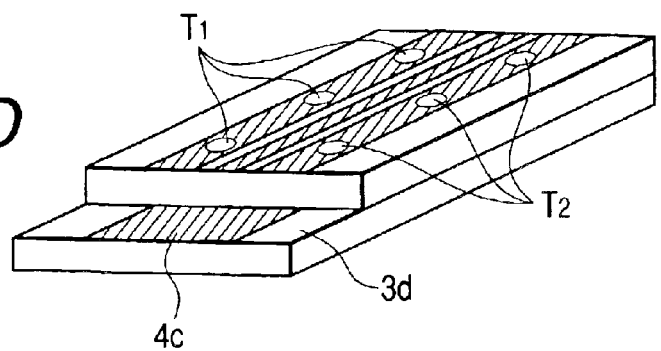
Figure 2E:
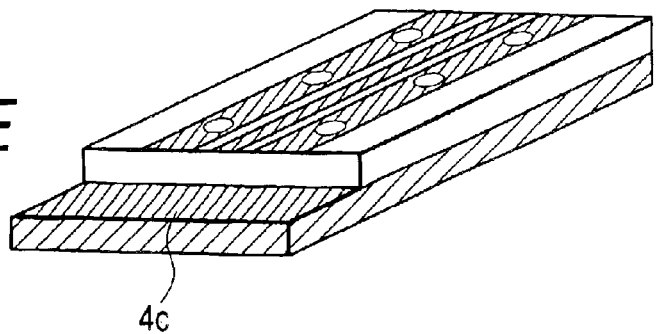

The ground electrode 4c is connected by the soldering process with the ground electrode 4d provided at the rear surface of the upper substrate 3a of the first layer and thereby the upper substrate 3a of the first layer is overlapped on the transmission line substrate 3b of the second layer. In this case, as explained above, since the transmission line substrate 3b of the second layer is formed a little longer in the longitudinal direction of the rectangular ceramic material, a part 3d of the transmission line substrate 3b of the second layer exposed on the upper surface of the ground electrode 4c is projected in the extending direction of the coaxial cable 1 from the upper substrate 3a of the first layer. This profile is illustrated in FIG. 2D.

In above explanation, the transmission line substrate 3b of the second layer is formed of a rectangular ceramic material and the ground electrode 4c is formed in the longitudinal direction of the ceramic material, but these may be formed of a metal material, for example, a metal member 3b' formed by plating a copper plate or copper block with gold. This profile is illustrated in FIG. 2C. The upper substrate 3a of the first layer is overlapped on the transmission line substrate 3b' of the second layer and the transmission line substrate 3b' of the second layer is then projected from the upper substrate 3a of the first layer in the extending direction of the coaxial cable 1. In this case, the entire surface of the upper surface where the transmission line substrate 3b' of the second layer is projected is formed as the ground electrode 4c. The member formed by plating a copper plate or copper block with gold is called the "metal member". This metal member is illustrated as the hatched area in FIG. 2E.

Next, a contact sleeve 2 will be explained. The contact sleeve 2 includes a cylindrical metal member 2A with which an external conductor 1b of the coaxial cable 1 is internally placed in contact. Moreover, projections 2a1, 2a2 are provided in parallel to the axial direction on the external circumference at the end part of the cylindrical member 2A.

The function to connect the coaxial cable 1, signal electrode 4 and ground electrodes 4a, 4b, 4c via the contact sleeve 2 will then be explained.

The external conductor 1b of the coaxial cable 1 is internally in contact with the cylindrical metal member 2A of the contact sleeve 2 and is connected to the cylindrical member 2A. This connection is executed with the soldering process or welding process. The connections which will be explained later are also conducted with the soldering process or welding process, unless otherwise explained particularly.

The core line 1a of the coaxial cable 1 is projected by removing the insulator 1c of the same coaxial cable 1. The core line 1a is connected to the signal electrode 4 of the ceramic upper substrate 3a of the first layer (hereinafter, referred only to as the upper substrate 3a of the first layer by omitting the ceramic material). Next, the projections 2a1, 2a2 parallel to the axial direction on the external circumference of the end part of the cylindrical member 2A are respectively connected to the ground electrodes 4a, 4b of the upper substrate 3a of the upper stage and the lower surface 2a3 of the cylindrical part of the cylindrical member 2A is connected simultaneously to the ground electrode 4c of the transmission line substrate 3b of the second layer.

In this case, the projections 2a1, 2a2 parallel to the axial direction on the external circumference are formed as the plurality of linear projections, but this projection may be formed as a single projection and may also be formed as a curved projection deformed toward the external side.

Next, with reference to FIGS. 4A and 4B, variation conditions of the line of electric force at the connecting portions of the coaxial cable 1 and transmission line substrates 3a, 3b will be explained. FIG. 4A illustrates the variation conditions of the line of electric force at the coaxial cable 1, transmission line substrates 3a, 3b and the connecting portions of these elements. FIG. 4B schematically illustrates the variation conditions of the line of electric force of FIG. 4A viewed from the optical transmission module M. In FIGS. 4A and 4B, the same elements having the identical functions are designated with the same reference numerals, and the same explanation as FIG. 3 is omitted here.

In FIGS. 4A and 4B, (101) indicates a point on the coaxial cable 1, while (102) indicates a point on the projections 2a1, 2a2 of the contact sleeve 2 connecting the coaxial cable 1 and upper substrate 3a, and (103) indicates a point on the signal electrode 4. At the lower stage of FIG. 4A, the line of electric force corresponding to each point is illustrated, while FIG. 4B schematically illustrates the variation conditions of the line of electric force for easier understanding. In general, the radial line of electric force is generated from the coaxial cable 1 to form the equal electric field. On the grounded coplanar line substrate 3, the uniform electric field which can be seen for the coaxial cable 1 cannot be formed.

Moreover, when a structure of the connecting point between the coaxial cable 1 and the upper substrate 3a of the first layer is changed, the line of electric force also changes extremely, electromagnetic wave is radiated, and effect of shield is lowered and thereby high frequency characteristic may also be deteriorated. In the coaxial cable 1, a signal energy is accumulated between the core line 1a (signal electrode 4) and the external conductor (ground electrodes 4a, 4b, 4c) and this signal energy is then transmitted. The connection structure considering such structure of coaxial cable 1 will be explained.

On the point (101) of the coaxial cable 1 in FIGS. 4A and 4B, the radial line of electric force is generated from the core line 1a of the coaxial cable 1.

On the point (102), the line of electric force cannot be radiated from the core line 1a unlike the coaxial cable 1a. Therefore, the line of electric force in the upper side tends to be divided into the right and left directions and the horizontal line of electric force tends to be maintained. Moreover, the line of electric force in the lower side tends to be centralized at the lower surface of the signal electrode 4. The contact sleeve 2 including the projections 2a1, 2a2 assists such tendency.

On the signal electrode 4 represented by the point (103) the line of electric force toward the right and left ground electrodes 4a, 4b are generated from the signal electrode 4 and the line of electric force is generated to the lower side from the lower surface of the signal electrode 4.

As explained above, the line of electric force smoothly changes from the point (101) to (102) and moreover to (103) to indicate the non-radial shape from the radial shape as the propagation mode, resulting in the effect that radiation of electromagnetic wave is prevented, shield effect can be improved and thereby the high frequency characteristic can also be improved.

With reference to FIGS. 5A and 5B, a modification example of the other connecting point between the coaxial cable 1 and the transmission line substrate 3 will be explained.

FIG. 5A illustrates the connecting area between the coaxial cable 1 and the upper substrate 3 and FIG. 5B is a side elevation of FIG. 5A. In FIGS. 5A and 5B, the reference numerals like those of FIGS. 2A to 2E and FIG. 3 designate the like elements in the identical specifications and functions, and the same explanation is omitted here. Only the new elements will be explained. Numeral 2B designates a cylindrical member of the contact sleeve 2.

In the transmission line substrate 3, the upper substrate 3a of the first layer and the transmission line substrate 3b of the second layer are structured in the same manner as illustrated in FIGS. 2A to 2E.

The contact sleeve 2 is formed of a cylindrical metal member 2B with which the external conductor 1b of the coaxial cable 1 is internally in contact and the end part of the cylindrical member 2B is formed as a semi-cylindrical portion 2b1.

The lower end surface in the axial direction of the semi-cylindrical portion 2b1 are defined as connecting surface for the ground electrodes 4a, 4b of the first layer and the lower cylindrical surface 2b3 of the cylindrical member 2B is connected to the ground electrode 4c of the second layer. Moreover, the core line 1a of the coaxial cable 1 is projected from the contact sleeve 2 and is in contact with the signal electrode 4 of the coaxial cable 1. Even in FIGS. 5A and 5B, the contact sleeve 2 provides the effects, as in the case of FIG. 3 and FIGS. 4A and 4B, that the line of electric force at the area near the connecting area between the coaxial cable 1 and optical transmission module changes smoothly, radiation of electromagnetic wave is prevented, the shield effect can also be improved and high frequency characteristic can also be improved.

A modification example of the other connecting area between the coaxial cable 1 and transmission line substrates 3a, 3b and the variation conditions of the line of electric force will be explained with reference to FIGS. 6A, 6B and 6C.

FIG. 6A illustrates a connecting area between the coaxial cable 1 and transmission line substrate 3. FIG. 6B is a side elevation of FIG. 6A. FIG. 6C schematically illustrate the variation conditions of the line of electric force of FIG. 6A viewed from the optical transmission module. In FIGS. 6A to 6C, the like elements having the same specifications and functions as those in FIGS. 2A to 2E and FIG. 3 are designated with the like reference numerals, and the same explanation is omitted here.

In regard to the grounded coplanar line substrate 3, the upper substrate 3a of the first layer and the transmission line substrate 3b of the second layer are structured in the same manner as those of FIGS. 2A to 2E.

The contact sleeve 2 forms a cylindrical metal member 2C with which the external conductor 1b of the coaxial cable 1 is in contact. The end part of the cylindrical member 2C is formed as a semi-cylindrical portion 2c1 and is formed of a cylindrical member 2C including a curved edge portion which may be formed by cutting the semi-cylindrical portion 2c1 in the circumferential direction at the plane obliquely crossing the axis.

The end surface in the axial direction of the semi-cylindrical portion 2c1 is connected with the ground electrodes 4a, 4b of the first layer, while the lower cylindrical surface 2c3 of the cylindrical member 2C is connected to the ground electrode 4c of the first layer. Moreover, the core line 1a of the coaxial cable 1 is connected to the signal electrode 4 within the semi-cylindrical member 2c1 of the contact sleeve 2.

In FIG. 6B, (201) is a point on the coaxial cable 1 including the ground electrode 4c at the lower side, while (202) is a point at the area near the end portion of the external conductor 1b at the connection of the coaxial cable 1 and transmission line substrate 3 with the contact sleeve 2, (203) is a point on the connecting surface between the signal electrode 4 and the core line 1a of the coaxial cable 1 and (204) is a point on the signal electrode 4, respectively.

FIG. 6C schematically illustrates variation conditions of the line of electric force generated corresponding to each point for further understanding. The extreme right end figure (201) of FIG. 6C illustrates the condition corresponding to the point (201). On the point (201), the radial line of electric force is generated upward from the core line 1a. Moreover, this figure illustrates the tendency that the radial line of electric force toward the lower side from the core line 1a is centralized to the lower surface of the signal electrode 4. On the point (202), the radial line of electric force is not generated as in the case of the coaxial cable 1 from the core line 1a, as illustrated in the second extreme right end figure (202) of FIG. 6C. This figure illustrates the tendency that the line of electric force toward the upper side is generated in division to the right and left ground electrodes 4a, 4b and the line of electric force toward lower side is centralized to the lower surface of the signal electrode 4.

On the point (203), as illustrated in the second extreme left end figure (203) of FIG. 6C, the core line 1a of the coaxial cable 1 and the signal electrode 4 are connected at the area near the end portion of the semi-cylindrical member 2c1 of the contact sleeve 2. Therefore, the line of electric force in the upper side from the core line 1a tends to be further divided to the right and left ground electrodes 4a, 4b due to the influence of the shielding effect of the semi-cylindrical portion 2c1 and is then centralized to the lower surface of the signal electrode 4.

On the point (204), as illustrated in the extreme left end figure (204) of FIG. 6C, the line of electric force from the core line 1a of the coaxial cable 1 is divided to the right and left ground electrodes 4a, 4b and is then centralized to the lower surface of the signal electrode 4.

As explained above, in comparison with FIGS. 4A and 4B, the figures (201) to (202), (203) and (204) respectively illustrate that the line of electric force changes smoothly, resulting in the effect that radiation of electromagnetic wave is prevented, shielding effect can be improved and high frequency characteristic can also be improved.

[Embodiment 2]

Although detail illustration is omitted here, the other modification example of the connection between a transmission line substrate and a coaxial cable in the optical transmission module of the present invention will be explained.

When a core line 1a of the coaxial cable 1 is connected to a signal electrode 4 of a grounded coplanar line 3a of the first layer, the positional alignment in the height direction is required from view point of control of radiation of electromagnetic wave. In this case, since the coaxial cable 1 is lower than the metal member or the second layer of the ground substrate, a spacer must be disposed to the bottom part of the coaxial cable 1.

Therefore, a projected portion is formed, in place of the spacer, so that the second layer consisting of the metal member or the ground substrate is projected in the extending direction of the coaxial cable more than the first layer including the grounded coplanar line formed on the second layer. The contact sleeve connected to the external conductor of the coaxial cable is connected to the projected portion of the second layer and the signal electrode of the first layer is connected to a core wire of the coaxial cable. This embodiment provides the similar effect as the [Embodiment 1].

[Embodiment 3]

With reference to FIG. 7, a connecting portion between a transmission line substrate of the optical transmission module to attain the second object and a coaxial cable will be explained. FIGS. 7A and 7B illustrate the other connection example between the transmission line substrate of the optical transmission module of FIGS. 1A and 1B and a coaxial cable. In FIGS. 7A and 7B, the like elements having the identical specifications and functions as those in FIGS. 2A to 2E are designated with the like reference numerals, and the same explanation is not repeated here. FIG. 7A illustrates a connection between the transmission line substrate in the optical transmission module of FIGS. 1A and 1B and a coaxial cable, while FIG. 7B is a cross-sectional view taken along the line B–B' after the connection of FIG. 7A.

In FIG. 7A, the transmission line substrate 3 is structured in the same manner as FIGS. 2A to 2E in the upper substrate 3a of the first layer and the transmission line substrate 3b of the second layer.

In this embodiment, the contact sleeve 2 of the [Embodiment 1] of FIG. 3 is used and a groove 6 is provided to the second transmission line substrate 3. The coaxial cable 1 can be fixed by connecting the contact sleeve 2 to the groove 6 and then embedding therein.

In FIG. 7B, the upper substrate 3a of the first layer and the coaxial cable 1 may be connected at both points a of the coaxial cable 1. According to this structure, radiation of electromagnetic wave can be prevented, the shielding effect can also be improved, high frequency characteristic can also be improved and strength of these connecting points can also be ensured at the connecting portions of the coaxial cable 1 and transmission line substrates 3a, 3b.

[Embodiment 4]

With reference to FIGS. 8A and 8B, the other connecting portion between the transmission line substrate of the optical transmission module to attain the second object and a coaxial cable will be explained. FIGS. 8A and 8B illustrate the other connecting point between the transmission line substrate of the optical transmission module of FIGS. 1A and 1B and a coaxial cable. In FIGS. 8A and 8B, the like elements as those of FIGS. 2A to 2E and FIG. 3 have the identical specifications and functions are designated with the like reference numerals and the same explanation is not repeated here. FIG. 8A illustrates the other connecting portion between the transmission line substrate of the optical transmission module of FIGS. 1A and 1B and a coaxial cable, while FIG. 8B illustrates a cross-sectional view among the line A–A' after the connection of FIG. 8A. The [Embodiment 4] proposes a method of fixing the connecting portion between the coaxial cable in the optical transmission module of the present invention.

As illustrated in FIG. 8A, a fixing jig 5 is connected to the ground electrodes 4a, 4b of the first upper substrate 3a and is also fixed to cover the coaxial cable 1 and contact sleeve 2 of the connection structure explained with reference to FIGS. 7A and 7B. The fixing jig 7 is formed of a conductor and is provided with a rectangular shape groove 5a in the longitudinal direction within the rectangular shape member. The coaxial cable 1 connected to the contact sleeve 2 is fixed in the manner as it is held by the groove 5a.

According to the structure explained above, at the connecting portion between the coaxial cable 1 and the transmission line substrates 3a, 3b, radiation of electromagnetic wave is prevented, the shielding effect can be improved, high frequency characteristic can also be improved and strength of the connecting portion can also be ensured.

With reference to FIGS. 9A to 9D, analysis of electromagnetic field in each connection profile between the transmission line substrate of the optical transmission module of the present invention explained above, and the coaxial cable will be explained.

Figure 9A:
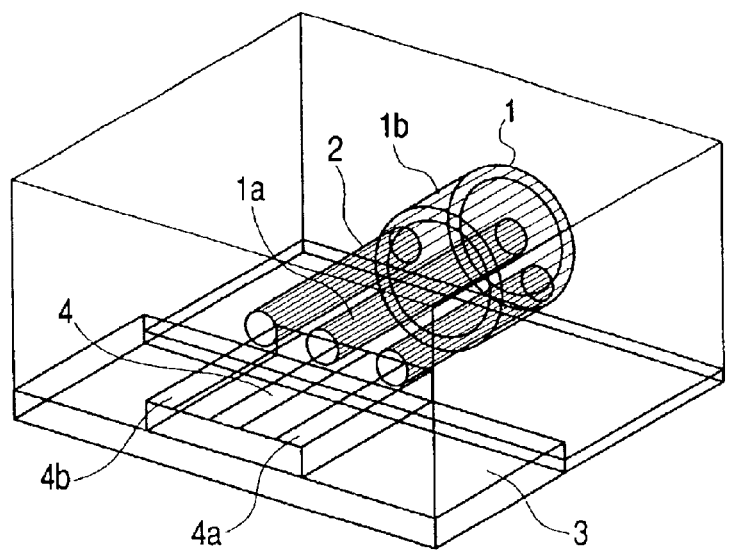
FIGS. 9A, 9B, 9C and 9D are diagrams illustrating a high frequency characteristic in each embodiment of the optical transmission module of the present invention.

FIG. 9A illustrates a connection profile wherein the external conductor 1b of the coaxial cable 1 is connected to the ground electrodes 4a, 4b of the upper substrate 3a at two positions within the plane including the internal conductor 1a with the contact sleeve 2 and is connected to the ground electrode 4c of the transmission line substrate 3b at the lower surface of the contact sleeve 2.

Figure 9B:
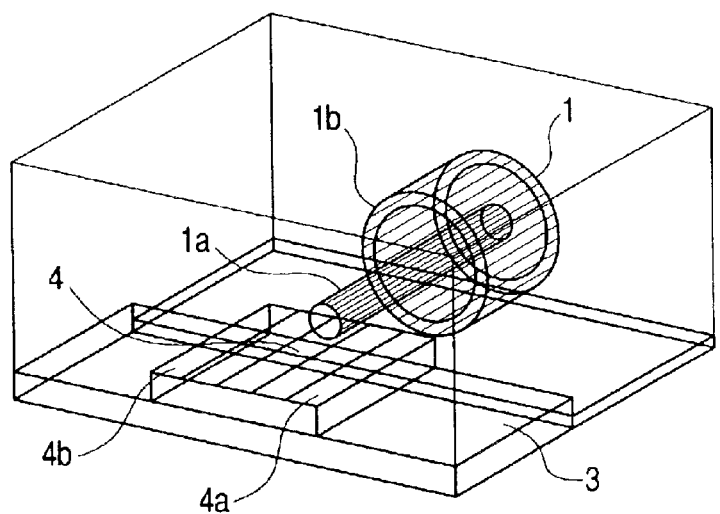

FIG. 9B illustrates a connection profile wherein the lower surface of the external conductor 1b of the coaxial cable 1 is connected to the ground electrode 4c of the transmission line substrate 3b without use of the contact sleeve 2.

Figure 9C:
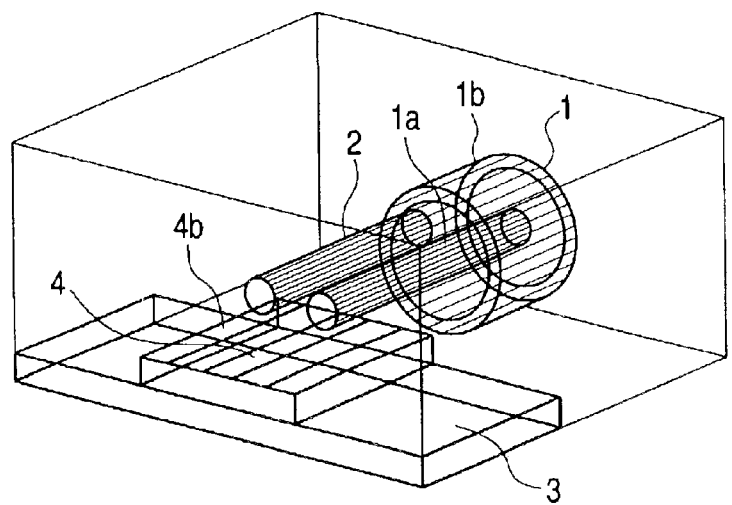

FIG. 9C illustrates a connection profile wherein the external conductor 1b of the coaxial cable 1 is connected to the ground electrode 4b of the upper substrate 3a only at one position in the plane including the internal conductor 1a with the contact sleeve 2.

Figure 9D:
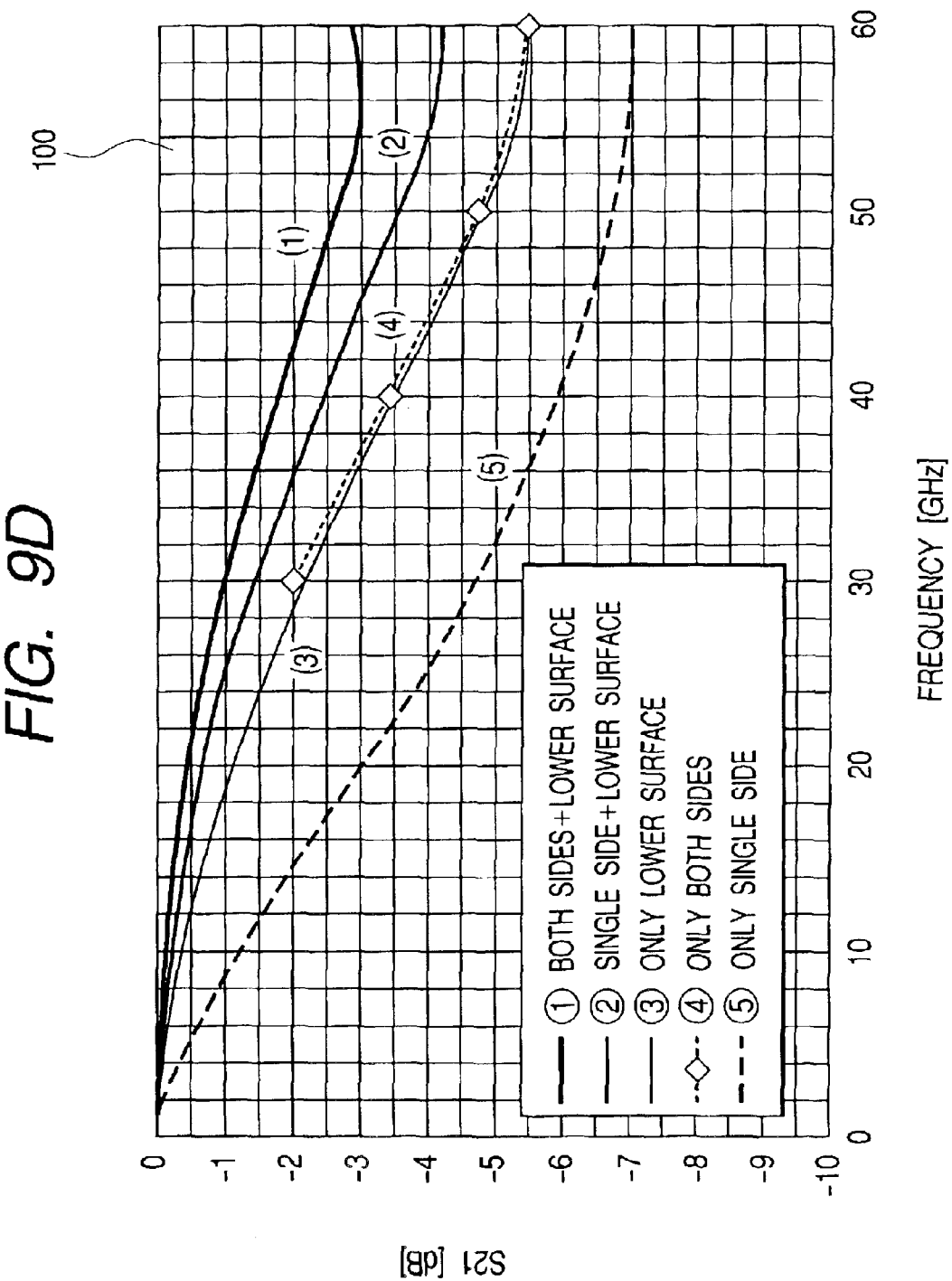
Figures 10A, 10B:
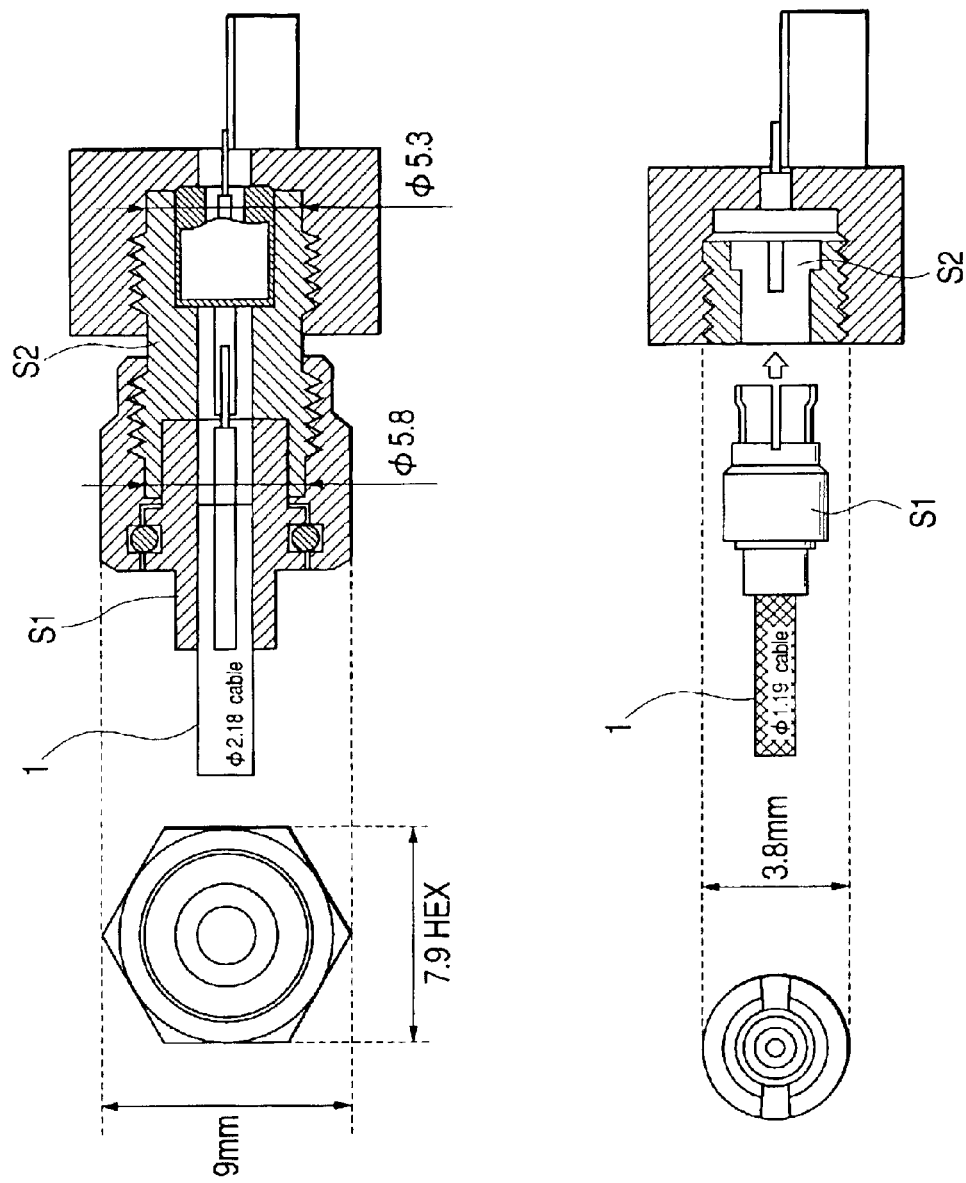
FIGS. 10A and 10B are diagrams illustrating a connector used for connection between an optical transmission module and a coaxial cable in the prior art.

FIG. 9D illustrates the frequency characteristics of connection structures of the connection profiles of FIGS. 9A, 9B and 9C. The vertical axis of the graph 100 indicates a transmission signal [dB] and the horizontal axis indicates a frequency [GHz].

In the graph 100, the characteristic (1) corresponds to the connection profile where the external conductor 1b of the coaxial cable 1 is connected, using the contact sleeve 2, to the ground electrodes 4a, 4b of the upper substrate 3a at two positions in the plane including the internal conductor 1a and is also connected to the ground electrode 4c of the transmission line substrate 3b at the lower surface of the contact sleeve 2. The characteristic (2) corresponds to the connection profile where the external conductor 1b of the coaxial cable 1 is connected to the ground electrodes 4a, 4b of the upper substrate 3a at a position in the plane including the internal conductor 1a using the contact sleeve 2 and is also connected to the ground electrode 4c of the transmission line substrate 3b at the lower surface of the contact sleeve 2. The characteristic (3) corresponds to the connection profile where the lower surface of the external conductor 1b of the coaxial cable 1 is connected to the ground electrode 4c of the transmission line substrate 3b. The characteristic (4) corresponds to the connection profile where the external conductor 1b of the coaxial cable 1 is connected, using the contact sleeve 2, to the ground electrodes 4a, 4b of the grounded coplanar line substrates 4a, 4b at two positions in the plane including the internal conductor 1a. The characteristic (5) corresponds to the connection profile where the external conductor 1b of the coaxial cable 1 is connected, using the contact sleeve 2, to the ground electrode 4b of the upper substrate 3a at one position in the plane including the internal conductor 1a.

In the graph 100, the connection profile (1) assures the most excellent high frequency characteristic, followed by the connection profiles (2), (3), (4) and (5) in this order.

The optical transmission module which emits a light beam when an electrical signal is inputted has been explained above, but the present invention has also been adapted to the optical transmission module which generates an electrical signal when an optical signal is inputted. Moreover, the grounded coplanar line substrate 3 has also been explained above, and the same effect can also be attained using the second transmission line substrate 3b of the metal member.

As explained above in detail, according to the structure of the present invention, a thin and small size optical transmission module connected to a coaxial cable which assures less radiation of interfering electromagnetic wave, excellent high frequency characteristic and no-generation of mechanical damage can be attained by providing an electromagnetic field mode alleviating portion of a dielectric material to the core wire part of the coaxial cable without use of a connector for connection.

What is claimed is:

1. An optical transmission module comprising:
a second layer consisting of a metal member or a ground substrate;
a first layer including a grounded coplanar line formed on said second layer; and
a coaxial cable, in which a signal electrode of said first layer connected to a core wire of said coaxial cable,
wherein said second layer includes a projection projected in the extending direction of said coaxial cable more than said first layer and a contact sleeve is connected to the external conductor of said coaxial cable and is connected to the projection of said second layer.

2. An optical transmission module comprising:
transmission line substrate layers; and
a coaxial cable for connecting the transmission line substrate layers;
wherein an external conductor of the coaxial cable is connected to the transmission line substrates via a contact sleeve having a projection which is fixed to the external conductor of the coaxial cable and projects in an extending direction of the coaxial cable;
wherein the transmission line substrates comprise a second layer consisting of a metal member or a ground substrate and a first layer including a grounded coplanar line formed on the second layer, and the metal member or the ground substrate also includes a projection projecting in the extending direction of the coaxial cable more than the first layer, and
wherein the projection of contact sleeve is connected to the grounded coplanar line of the first layer, and the contact sleeve is connected to the projection of the metal member or ground substrate of the second layer.

3. An optical transmission module comprising:
transmission line substrate layers; and
a coaxial cable for connecting the transmission line substrate layers;
wherein an external conductor of the coaxial cable is connected to the transmission line substrates via a contact sleeve, the contact sleeve having a projection which is fixed to the external conductor of the coaxial cable and projects in an extending direction of the coaxial cable;
wherein the contact sleeve comprises a cylindrical member of which end portion is formed in the semi-cylindrical shape, the transmission line substrate comprising a second layer formed of a metal member or a ground substrate and a first layer including a grounded coplanar line formed on the second layer, and the metal member or ground substrate includes a projection in the extending direction of the coaxial cable more than the first layer; and
wherein a semi-cylindrical portion of the contact sleeve covers the grounded coplanar line of the first layer and connects its end portion in the axial direction to the grounded coplanar line of the first layer, and the contact sleeve is connected to the projection of the metal member or ground substrate of the second layer.

4. An optical transmission module comprising:
transmission line substrate layers; and
a coaxial cable for connecting the transmission line substrate layers;
wherein an external conductor of the coaxial cable is connected to the transmission line substrates via a contact sleeve, the contact sleeve is provided with a projection which is fixed to the external conductor of the coaxial cable and projects in an extending direction of the coaxial cable;
wherein the contact sleeve formed of a cylindrical member of which end portion is formed in the semi-cylindrical shape including a curved edge portion in which the semi-cylindrical portion is cut in the circumferential direction at the plane obliquely crossing the axis;
wherein the transmission line substrate comprises a second layer consisting of a metal member or a ground substrate and a first layer including a grounded coplanar line formed on the second layer, and the metal member or ground substrate includes a projection in the extending direction of the coaxial cable more than the first layer, and
wherein the semi-cylindrical portion of the contact sleeve covers the grounded coplanar line of the first layer and is connected to the ground coplanar line of the first layer at its end portion in the axial direction, and the contact sleeve is connected to the projection of the metal member or ground substrate of the second layer.

* * * * *